United States Patent
Saitoh

(10) Patent No.: US 11,814,729 B2
(45) Date of Patent: Nov. 14, 2023

(54) METHOD FOR MANUFACTURING GLASS ARTICLE AND METHOD FOR HEATING THIN SHEET GLASS

(71) Applicant: NIPPON ELECTRIC GLASS CO., LTD., Otsu (JP)

(72) Inventor: Takayoshi Saitoh, Otsu (JP)

(73) Assignee: NIPPON ELECTRIC GLASS CO., LTD., Otsu (JP)

(*) Notice: Subject to any disclaimer, the term of this patent is extended or adjusted under 35 U.S.C. 154(b) by 254 days.

(21) Appl. No.: 17/292,829

(22) PCT Filed: Oct. 23, 2019

(86) PCT No.: PCT/JP2019/041428
§ 371 (c)(1),
(2) Date: May 11, 2021

(87) PCT Pub. No.: WO2020/105345
PCT Pub. Date: May 28, 2020

(65) Prior Publication Data
US 2021/0395894 A1     Dec. 23, 2021

(30) Foreign Application Priority Data
Nov. 20, 2018   (JP) .................. 2018-217498

(51) Int. Cl.
*C23C 16/46*   (2006.01)
*C03C 17/245*  (2006.01)
(Continued)

(52) U.S. Cl.
CPC ............ *C23C 16/46* (2013.01); *C03C 17/245* (2013.01); *C23C 14/541* (2013.01);
(Continued)

(58) Field of Classification Search
CPC .............................. C23C 14/541; C23C 16/46
See application file for complete search history.

(56) References Cited

U.S. PATENT DOCUMENTS

2010/0215872 A1* 8/2010 Sivaramakrishnan .. C23C 16/54
                                                              118/724
2013/0269614 A1* 10/2013 Zhao ...................... C23C 14/02
                                                              118/725
(Continued)

FOREIGN PATENT DOCUMENTS

JP    S55-158487 A    12/1980
JP    S55158487 A     12/1980
(Continued)

OTHER PUBLICATIONS

International Search Report for PCT/JP2019/041428 dated Jan. 21, 2021, 3 pages.

*Primary Examiner* — Joseph A Miller, Jr.
(74) *Attorney, Agent, or Firm* — KILPATRICK TOWNSEND & STOCKTON LLP

(57) ABSTRACT

A method for manufacturing a glass article includes a heating step that heats a heating object made of glass. The heating step includes heating the heating object by converting, by a converter arranged between the heating object and a radiant heat source that radiates infrared light, a spectrum of the infrared light radiated from the radiant heat source and causing the heating object to absorb the infrared light radiated from the converter. The converter includes: an infrared light absorber that generates heat by absorbing the infrared light radiated from the radiant heat source; and an infrared light radiator made of a silicon-containing material. The infrared light radiator is heated through thermal conduction from the infrared light absorber. At least part of a
(Continued)

surface of the converter facing the heating object includes at least part of a surface of the infrared light radiator.

10 Claims, 4 Drawing Sheets

(51) Int. Cl.
    *C23C 14/54*     (2006.01)
    *H05B 3/00*     (2006.01)
    *H05B 3/10*     (2006.01)
(52) U.S. Cl.
    CPC ............. *H05B 3/0038* (2013.01); *H05B 3/10* (2013.01); *C03C 2218/152* (2013.01); *C03C 2218/154* (2013.01); *C03C 2218/31* (2013.01); *H05B 2203/025* (2013.01)

(56) References Cited

U.S. PATENT DOCUMENTS

| | | | |
|---|---|---|---|
| 2019/0246457 A1* | 8/2019 | Aoki | H01K 1/14 |
| 2020/0122112 A1* | 4/2020 | Aoki | H05B 3/44 |

FOREIGN PATENT DOCUMENTS

| | | | |
|---|---|---|---|
| JP | S63-129986 U | | 6/1988 |
| JP | S63-129986 U | | 8/1988 |
| JP | H02-192686 A | | 7/1990 |
| JP | H06-260422 A | | 9/1994 |
| JP | WO2018079386 | * | 5/2018 |
| WO | WO2013-018483 | * | 7/2012 |
| WO | WO2013/018483 A1 | | 2/2013 |
| WO | WO2013/018483 A1 | | 7/2013 |

* cited by examiner

METHOD FOR MANUFACTURING GLASS ARTICLE AND METHOD FOR HEATING THIN SHEET GLASS

TECHNICAL FIELD

The present invention relates to a method for manufacturing a glass article and a method for heating a thin glass sheet.

BACKGROUND ART

Patent Document 1 discloses, as a method for heating a glass substrate, a known technique in which infrared light radiated from a radiant heat source, such as a halogen lamp, is absorbed by the glass substrate to heat the glass substrate.

PRIOR ART DOCUMENTS

Patent Documents

Patent Document 1: Japanese Laid-Open Patent Publication No. 6-260422

SUMMARY OF THE INVENTION

Problems that the Invention is to Solve

The absorption wavelength range of glass in the infrared region is narrow. Thus, when infrared light is absorbed by a heating object made of glass to heat the heating object, most of the infrared light radiated from the radiant heat source is transmitted through the heating object without being absorbed by the heating object. Accordingly, the infrared light radiated from the radiant heat source is prevented from being efficiently converted into the heat of the heating object. This increases the power consumption necessary for heating the heating object to a target temperature.

It is an objective of the present invention to reduce the power consumption for heating a heating object made of glass.

Means for Solving the Problems

An aspect of the present invention provides a method for manufacturing a glass article. The method includes a heating step that heats a heating object made of glass. The heating step includes heating the heating object by converting, by a converter arranged between the heating object and a radiant heat source that radiates infrared light, a spectrum of the infrared light radiated from the radiant heat source and causing the heating object to absorb the infrared light radiated from the converter. The converter includes: an infrared light absorber that generates heat by absorbing the infrared light radiated from the radiant heat source; and an infrared light radiator made of a silicon-containing material. The infrared light radiator is heated through thermal conduction from the infrared light absorber. At least part of a surface of the converter facing the heating object includes at least part of a surface of the infrared light radiator.

In some embodiments, the infrared light absorber may be made of a blackbody-like material.

In some embodiments, the infrared light radiator may be made of glass.

In some embodiments, the heating object may be a thin glass sheet having a thickness of 0.3 mm or less.

In some embodiments, the glass article may be a film-coated glass sheet obtained by forming a thin film on a surface of the thin glass sheet. The heating step may be performed to heat the thin glass sheet during formation of the thin film on the surface of the thin glass sheet through CVD or sputtering.

In some embodiments, the converter may include a transmission portion through which the infrared light radiated from the radiant heat source is transmitted.

In some embodiments, the infrared light radiator may be in contact with the infrared light absorber.

Another aspect of the present invention provides a method for heating a thin glass sheet having a thickness of 0.3 mm or less. The method includes heating the thin glass sheet by converting, by a converter arranged between the thin glass sheet and a radiant heat source that radiates infrared light, a spectrum of the infrared light radiated from the radiant heat source and causing the thin glass sheet to absorb the infrared light radiated from the converter. The converter includes: an infrared light absorber that generates heat by absorbing the infrared light radiated from the radiant heat source; and an infrared light radiator made of a silicon-containing material. The infrared light radiator is heated through thermal conduction from the infrared light absorber.

Effects of the Invention

The present invention reduces the power consumption for heating a heating object made of glass.

MODES FOR CARRYING OUT THE INVENTION

A method for manufacturing a glass article according to an embodiment of the present invention manufactures a film-coated glass sheet having a thin film formed on the surface of a thin glass sheet. The method for manufacturing the film-coated glass sheet includes heating the thin glass sheet and forming the thin film on the surface of the thin glass sheet by performing a film-forming process on the heated glass substrate through chemical vapor deposition (CVD) or sputtering. Examples of the thin film include a metal oxide film, such as an indium tin oxide film, a fluorine-doped tin oxide film, a zinc oxide film, and an antimony-doped tin oxide film.

Examples of the thin glass sheet include a silicate glass, a borate glass, a non-alkali glass, a phosphate glass, and a crystallized glass. In some embodiments, the thin glass sheet is preferably glass in which the emissivity of a wavelength of 5 to 8 µm is 90% or more. In a silicate glass, a non-alkali glass, and a crystallized glass, the emissivity of a wavelength of 5 to 8 µm is 90% or more. In some embodiments, the thickness of the thin glass sheet is 0.3 mm or less and is preferably 0.2 mm or less. The lower limit value of the thickness of the thin glass sheet is, for example, 3 µm.

Figure 1:
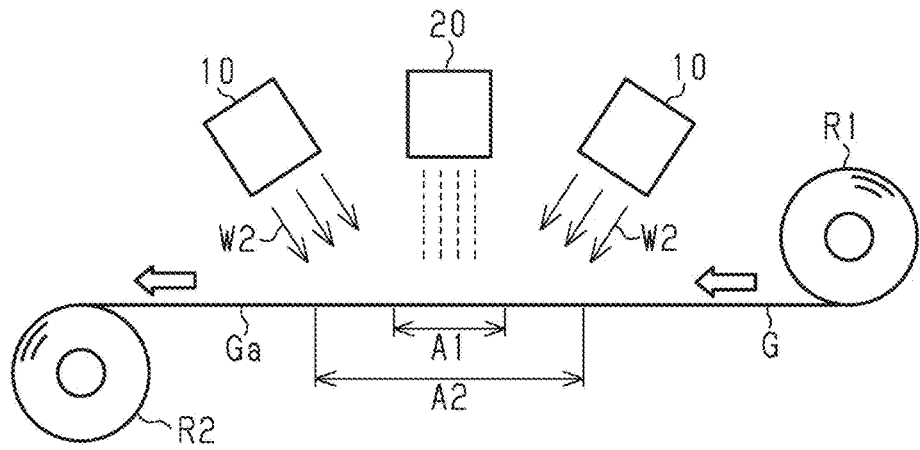
FIG. 1 is a diagram showing a method for manufacturing a film-coated glass sheet.

As shown in FIG. 1, the embodiment includes a heating process for an elongated thin glass sheet G, which is continuously fed from a first glass roller R1. The thin glass sheet G is subjected to a heating process using heating devices 10 and a film-forming process using a film-forming device 20. The film-forming process forms a film-coated glass sheet Ga (glass article), which is collected by being wound onto a second glass roller R2.

The heating devices 10 are located such that the heating devices 10 can heat the thin glass sheet G located in a heating region A2. The heating region A2 is set so as to include a film-forming region A1, where a thin film is formed by the film-forming device 20. In some embodiments, two heating devices 10 are arranged on opposite sides of the film-forming device 20, respectively. In the embodiment shown in FIG. 1, the heating devices 10 are arranged on the upstream side and the downstream side of the film-forming device 20 in the direction in which the thin glass sheet G moves, respectively.

Figure 2:
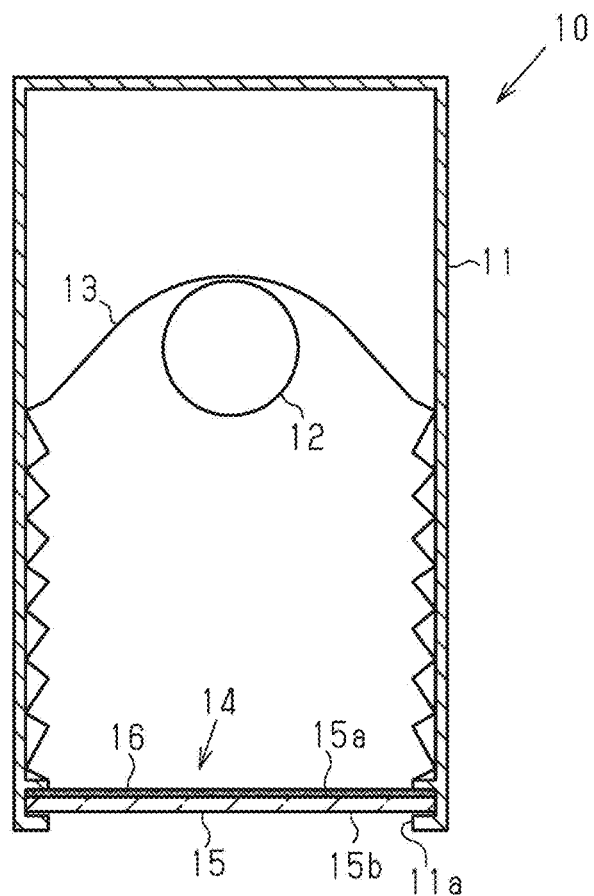
FIG. 2 is a diagram showing the heating device.

As shown in FIG. 2, the heating device 10 includes a casing 11 having an opening 11a, a radiant heat source 12 arranged in the casing 11, and a light-gathering mirror 13. The light-gathering mirror 13 turns infrared light, radiated from the radiant heat source 12, into a parallel beam traveling toward the opening 11a. Examples of the radiant heat source 12 include a radiant heat source, such as a halogen lamp or a xenon lamp, that heats a heating object using radiant heat.

The opening 11a of the casing 11 is provided with a converter 14, which converts the spectrum of infrared light radiated from the radiant heat source 12. The converter 14 includes a plate-shaped infrared light radiator 15, which is made of a silicon-containing material (hereinafter referred to as Si-containing material). Examples of the Si-containing material of the infrared light radiator 15 include glass, silicon nitride, mullite, aluminum silicate, cordierite, and zircon. Examples of the glass include a silicate glass, a non-alkali glass, and a crystallized glass.

In some embodiments, the Si-containing material of the infrared light radiator 15 preferably has a radiation characteristic similar to that of the thin glass sheet G (heating object), for example, an emissivity at the wavelength of 5 to 8 µm of 90% or more. More preferably, the Si-containing material of the infrared light radiator 15 has the same radiation characteristic as the thin glass sheet G. The glass of the infrared light radiator 15 preferably has a limited thermal expansion (for example, has a thermal expansion coefficient of 60 or less).

The infrared light radiator 15 includes a first surface 15a and a second surface 15b opposite to the first surface 15a. The first surface 15a is located such that the infrared light from the radiant heat source 12 enters the first surface 15a. The second surface 15b faces the heating object (thin glass sheet G). The thickness of the infrared light radiator 15, which is defined as the distance between the first surface 15a and the second surface 15b, is preferably 5 mm or less and more preferably 2 mm or less.

The first surface 15a of the infrared light radiator 15 is provided with an infrared light absorber 16. In some embodiments, the infrared light absorber 16 is made of a blackbody-like material. In some embodiments, the infrared light absorber 16 is a film-shaped portion formed by applying blackbody-like paint to the first surface 15a of the infrared light radiator 15, and the infrared light absorber 16 is uniformly arranged on the entire first surface 15a. For example, the emissivity of the infrared light absorber 16 is preferably 90% or more and is more preferably 95% or more. Any type of blackbody-like paint may be used for the infrared light absorber 16. For example, a commercially available blackbody-like paint (JSC-3, produced by Japan Sensor Corporation) may be used. The infrared light absorber 16 may be made of a black substance such as carbon.

The second surface 15b of the infrared light radiator 15 is externally exposed. Thus, at least part of the surface of the converter 14 facing the heating object includes at least part of the second surface 15b of the infrared light radiator 15.

The heating process (heating step) using the heating device 10 will now be described.

Figure 3:
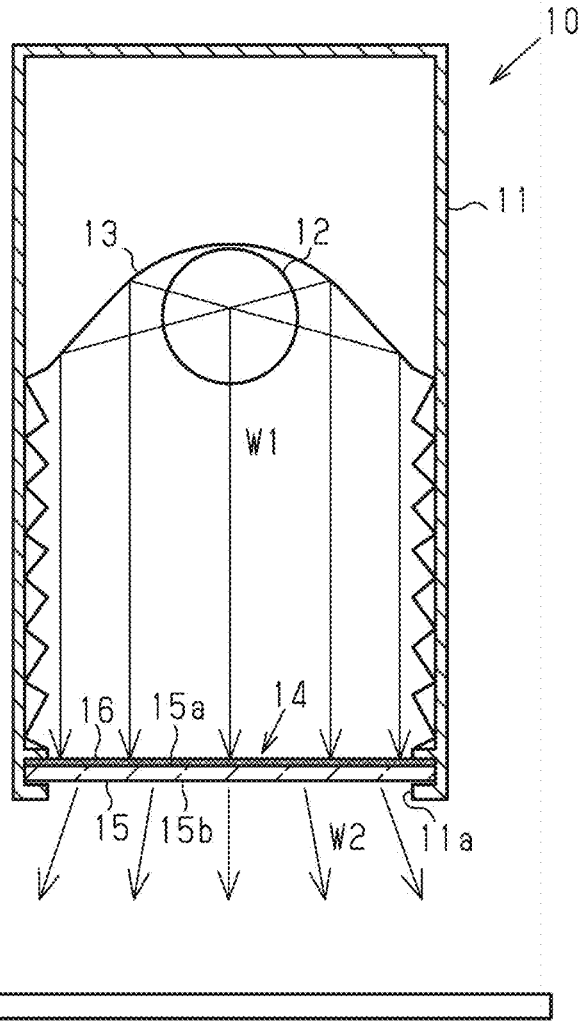
FIG. 3 is a diagram showing wavelength conversion performed by the converter.

As shown in FIG. 3, infrared light W1 is radiated from the radiant heat source 12 of the heating device 10. Then, the infrared light W1 is turned into a parallel beam by the light-gathering mirror 13 and absorbed by the infrared light absorber 16 of the converter 14. After absorbing the infrared light W1, the infrared light absorber 16 generates heat through heat radiation. When the infrared light absorber 16 generates heat, the infrared light radiator 15 in contact with the infrared light absorber 16 is heated through thermal conduction. From the heated second surface 15b of the infrared light radiator 15, infrared light W2 is emitted. The infrared light W2 has a spectrum based on the radiation characteristic of the Si-containing material of the infrared light radiator 15.

Thus, the converter 14 absorbs the infrared light W1, which is emitted from the radiant heat source 12, and radiates the infrared light W2, which differs from the infrared light W1 in spectrum. That is, the converter 14 converts the spectrum of the infrared light W1, which is radiated from the radiant heat source 12, into the spectrum based on the radiation characteristic of the Si-containing material of the infrared light radiator 15.

As shown in FIGS. 1 and 3, the thin glass sheet G absorbs the infrared light W2 in the heating region A2, where the infrared light W2 is radiated from the heating device 10. By generating heat through heat radiation, the thin glass sheet G that has absorbed the infrared light W2 is heated to a temperature suitable for the film-forming process (for example, approximately 500 to 600° C.).

The infrared light W2 having the spectrum based on the radiation characteristic of the Si-containing material has a large proportion of the wavelength absorbed by the glass and a small proportion of the wavelength that is not absorbed by the glass. For example, the proportion of the radiance of the wavelength absorbed by the glass relative to the radiance of the entire wavelength of the infrared light W2 is 80% or more. Thus, most of the infrared light W2 is absorbed by the thin glass sheet G without being transmitted through the thin glass sheet G. This allows the infrared light W2 radiated from the heating device 10 to be efficiently converted into the heat of the thin glass sheet G.

As shown in FIG. 1, the film-forming device 20 is used to perform the film-forming process in the film-forming region A1 for the thin glass sheet G that has been heated by the heating device 10. The film-forming device 20 may be a general film-forming device applied to a film-forming process using CVD or sputtering.

The film-coated glass sheet Ga, on which a thin film is formed, passes through the heating region A2 of the heating device 10 and reaches a position where the infrared light W2 is not incident from the heating device 10. This sharply decreases the temperature of the film-coated glass sheet Ga. After passing through the heating region A2 and decreasing in temperature, the film-coated glass sheet Ga is wound onto the second glass roller R2 and collected.

The present embodiment achieves the following advantages.

(1) The method for manufacturing the glass article includes the step of heating the heating object made of glass (thin glass sheet G). The heating step includes heating the heating object by converting, by the converter 14 arranged between the heating object and the radiant heat source 12 that radiates the infrared light W1, the spectrum of the infrared light W1 radiated from the radiant heat source 12 and causing the heating object to absorb the infrared light W2 radiated from the converter 14. The converter 14 includes the infrared light absorber 16, which generates heat by absorbing the infrared light W1 radiated from the radiant heat source 12, and the infrared light radiator 15, which is made of a silicon-containing material and is heated through thermal conduction from the infrared light absorber 16. At least part of the surface of the converter 14 facing the heating object includes at least part of the surface of the infrared light radiator 15.

In this structure, the infrared light W2, which has a large proportion of the wavelength absorbed by the glass and a small proportion of the wavelength that is not absorbed by the glass, is radiated from the converter 14. This allows most of the infrared light W2 radiated from the converter 14 to be absorbed by the heating object made of glass without being transmitted through the heating object. Accordingly, the infrared light W2 radiated from the converter 14 is efficiently converted into the heat of the heating object. This lowers the power consumption necessary for heating the heating object.

(2) When the infrared light absorber 16 is made of a blackbody-like material, the infrared light absorber 16 can absorb the infrared light W1 more efficiently.

(3) When the infrared light radiator 15 is made of glass, the infrared light W2 radiated from the converter 14 is converted into the heat of the heating object more efficiently.

(4) The heating object is a thin glass sheet having a thickness of 0.3 mm or less.

As compared to a thicker glass, the thin glass sheet has a smaller heat capacity and is therefore more likely to become cool due to external temperature. Thus, in order to keep the thin glass sheet heated at a target temperature, it is effective to irradiate the thin glass sheet with infrared light so that the radiant heat causes the thin glass sheet to generate heat. However, irradiating the thin glass sheet with infrared light and heating the thin glass sheet increase the transmittance of infrared light due to the small thinness of the thin glass sheet and worsens the heating efficiency relative to the power consumption. Accordingly, employing the above-described process for heating the thin glass sheet further lowers the power consumption necessary for heating the heating object.

(5) The glass article is the film-coated glass sheet Ga, which is obtained by forming a thin film on the surface of the thin glass sheet G. In the method for manufacturing the glass article, the above-described heating step is performed to heat the thin glass sheet G during formation of the thin film on the surface of the thin glass sheet G through CVD or sputtering.

When CVD or sputtering is performed to form a thin film, strict management is required for the temperature of an object on which the thin film is formed. In the above-described step that heats the heating object using the infrared light W2 converted by the converter 14, the heating object is heated to the target temperature and decreased in temperature from the heated state in a short period of time. Thus, this step is suitable for the heating method when a thin film is formed through CVD or sputtering.

(6) The infrared light radiator 15 is in contact with the infrared light absorber 16.

In this structure, heat is efficiently transferred from the infrared light absorber 16 to the infrared light radiator 15. This quickly increases the temperature of the second surface 15b of the infrared light radiator 15 (the surface of the converter 14 facing the heating object) with an improved responsibility.

(7) The infrared light radiator 15 has a thickness of 5 mm or less.

In this structure, the thermal conduction from the infrared light absorber 16 quickly increases the temperature of the second surface 15b of the infrared light radiator 15 (the surface of the converter 14 facing the heating object) with an improved responsibility.

The above-described embodiment may be modified as follows. The above-described embodiment and the following modifications can be combined as long as the combined modifications remain technically consistent with each other.

The surface of the converter 14 facing the heating object may be partially provided with a portion made of material other than the Si-containing material.

The infrared light absorber 16 does not have to be made of blackbody-like paint. Examples of other materials that can be used to form the infrared light absorber 16 include a blackbody-like tape and ceramic such as silicon carbide.

The infrared light radiator 15 does not need to be plate-shaped. Instead, for example, the infrared light radiator 15 may have a block shape or lens shape. In this case, the surface (first surface 15a) where the infrared light W1 is incident from the radiant heat source 12 and the surface (second surface 15b) where the infrared light W2 is radiated toward the heating object do not need to be directed in opposite directions.

The infrared light radiator 15 may have a film shape. For example, the infrared light absorber 16 may be plate-shaped and made of ceramic, and the infrared light radiator 15 may be a glass coat formed from a powdered glass that adheres to the surface of the infrared light absorber 16.

Figure 4:
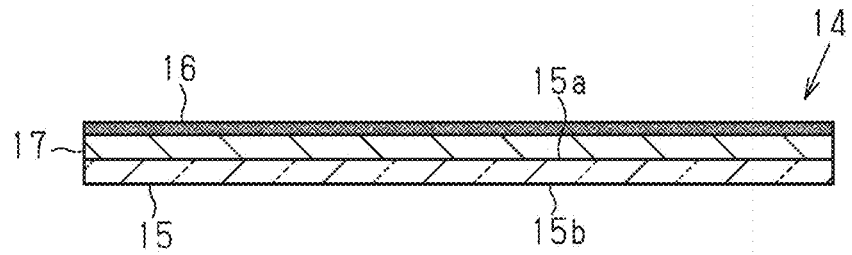
FIG. 4 is a cross-sectional view showing the converter according to a modification.
Figure 5A:
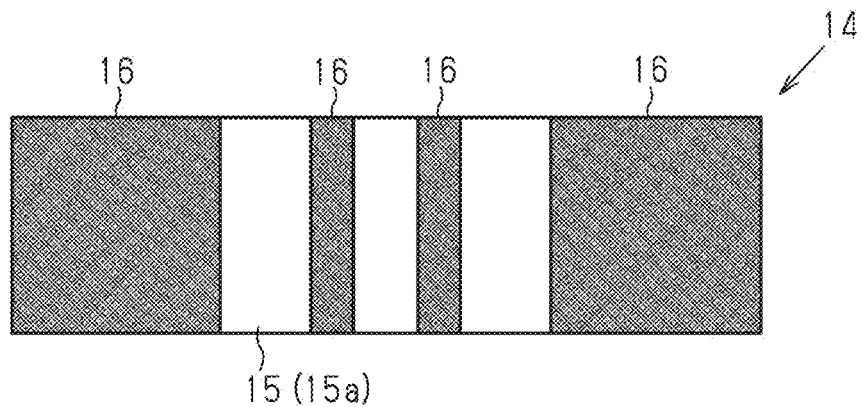
FIG. 5A is a front view showing the converter according to a modification.
Figure 5B:
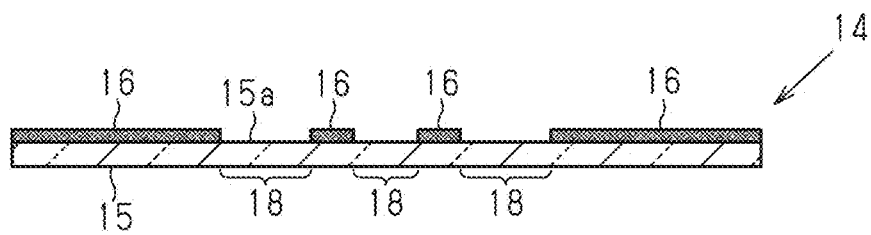
FIG. 5B is a cross-sectional view showing the converter according to the modification.
Figure 6A:
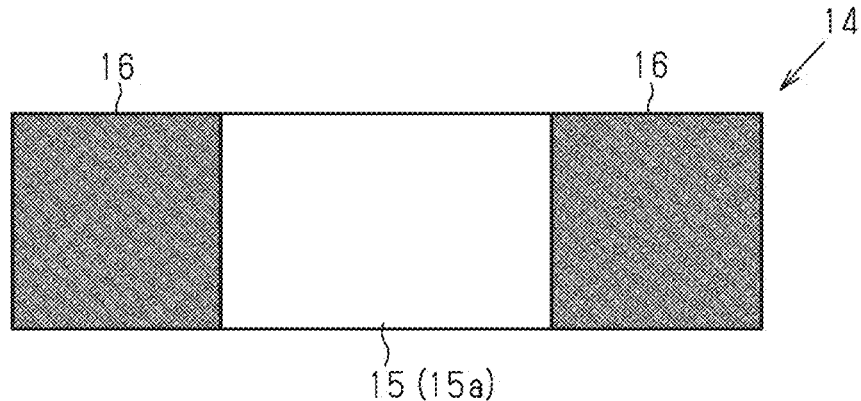
FIG. 6A is a front view showing the converter according to a modification.
Figure 6B:
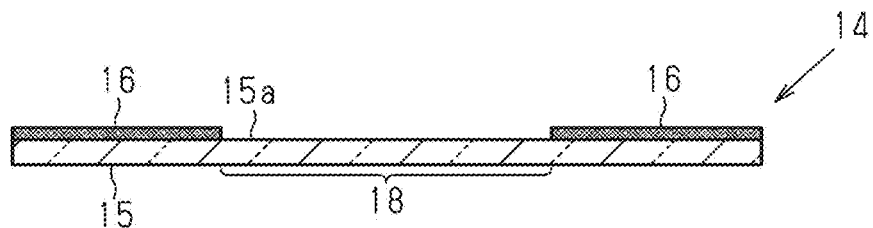
FIG. 6B is a cross-sectional view showing the converter according to the modification.

As shown in FIG. 4, a thermal conduction portion 17 may be arranged between the infrared light radiator 15 and the infrared light absorber 16 of the converter 14. The thermal conduction portion 17 is made of, for example, a thermally-conductive substance capable of transferring the heat of the infrared light absorber 16 to the infrared light radiator 15.

The converter 14 may include a transmission portion through which the infrared light W1 radiated from the radiant heat source 12 is transmitted. For example, as shown in FIGS. 5A, 5B, 6A, and 6B, the top of the first surface 15a of the infrared light radiator 15 partially includes portions on which the infrared light absorber 16 is not provided. In correspondence with the portions on which the infrared light absorber 16 is not provided, the infrared light radiator 15 has portions (transmission portions 18) through which the infrared light W1 incident from the radiant heat source 12 is transmitted. Arranging the transmission portions 18 easily controls the temperature distribution of the heating object when heated. For example, it is possible to uniformly heat the entire heating object, and it is also possible to partially raise the temperature of a specific part of the heating object.

Figure 7:
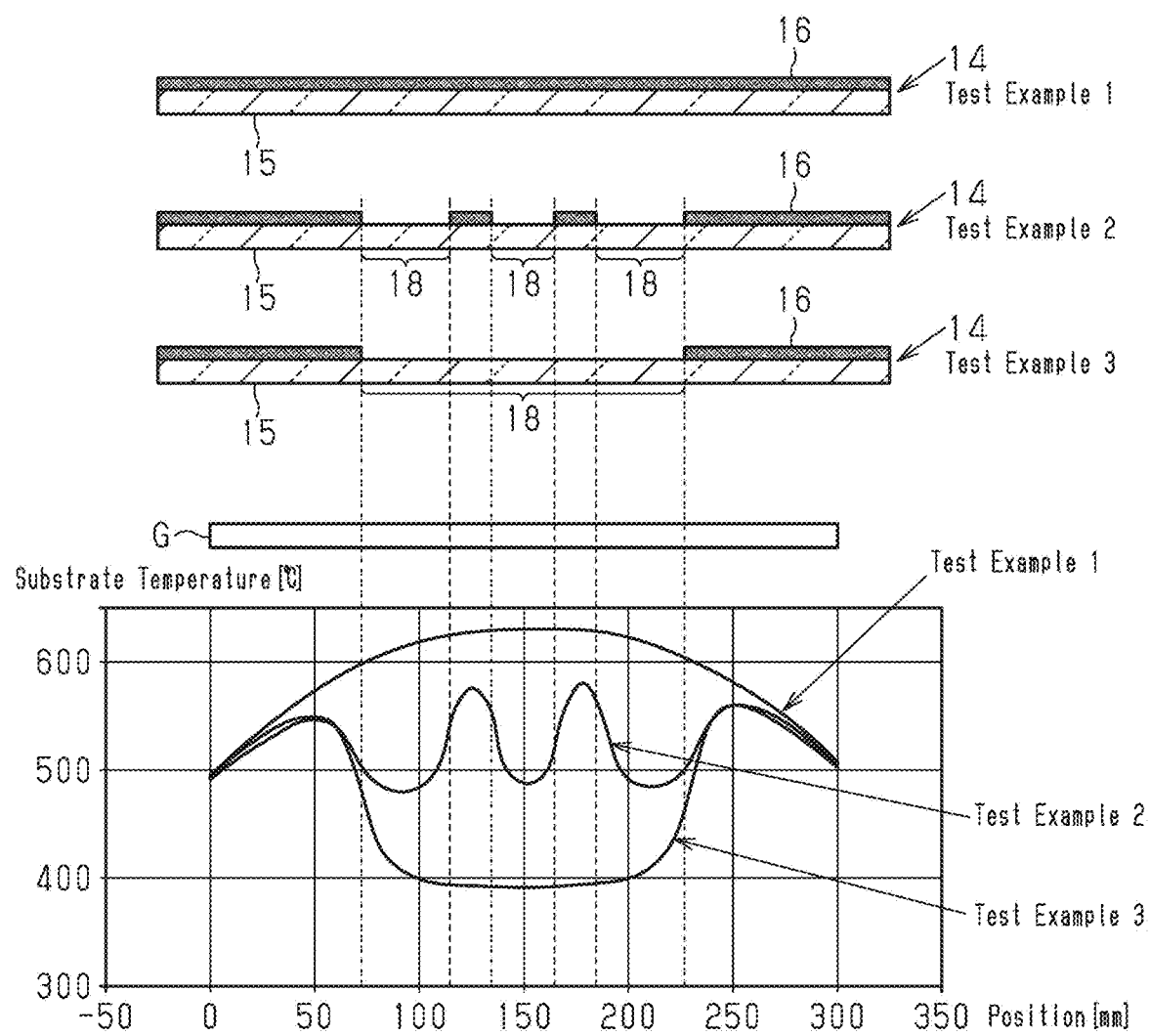
FIG. 7 is a diagram illustrating the relationship between the position of the transmission portion in the converter and a temperature distribution of the heating object.

The graph of FIG. 7 shows the temperature distribution of the thin glass sheet G when the heating process is performed using the converter 14 of the heating device 10 that does not include the transmission portions 18 (Test Example 1) or the converter 14 that includes the transmission portion(s) 18 (Test Examples 2 and 3). In the converter 14 of Test Example 1, the entire first surface 15a is provided with the infrared light absorber 16. In the converter 14 of Test Example 2, the portion corresponding to a middle part of the thin glass sheet G (heating object) includes several portions that are not provided with the infrared light absorber 16. In the converter 14 of Test Example 3, the entire portion corresponding to the middle part of the thin glass sheet G (heating object) does not include the infrared light absorber 16.

As shown in the graph of FIG. 7, when the converter 14 of Test Example 1 is used, the thin glass sheet G has a higher temperature at the middle part than at the opposite edges. When the converters 14 of Test Example 2 and Test Example 3 are used, the middle part of the thin glass sheet G has sections that are relatively low in temperature in correspondence with the portions (transmission portions 18) that do not include the infrared light absorber 16. Thus, arranging the transmission portions 18 allows the temperature of each section of the heating object to be controlled. Further, adjusting the positions of the transmission portions 18 allows the entire heating object to be heated more uniformly and allows the temperature of a specific part of the heating object to be relatively high or low.

The converter 14 may include a first converting section and a second converting section. The first converting section converts the infrared light W1, radiated from the radiant heat source 12, into the infrared light W2 of a spectrum having a first pattern. The second converting section converts the infrared light W1 into the infrared light W2 of a spectrum having that differs from the first pattern. For example, part of the infrared light radiator 15 is provided with a section made of a second Si-containing material having a different radiation characteristic, so that the infrared light of the spectrum having a second pattern based on the second Si-containing material is radiated from the second Si-containing material. In other words, the infrared light radiator 15 may include at least two types of Si-containing material that radiate infrared light of spectra having patterns that differ from each other.

In the same manner as providing the transmission portions 18, providing the converter 14 with the first converting section and the second converting section easily controls the temperature distribution of the heating object when heated. Further, multiple second converting sections may be provided. In this case, the spectra of the infrared light radiated from the second converting sections may be the same or differ from each other.

The atmosphere of the region between the heating device 10 and the heating object is not particularly limited. In some embodiments, the atmosphere of the region between the heating device 10 and the heating object may preferably have a water vapor amount of 2 g/m³ or less (for example, vacuum). When the atmosphere of the region has a small water vapor amount, the infrared light W2 radiated from the converter 14 of the heating device 10 is less likely to be absorbed by the water vapor contained in the region. Thus, the infrared light W2 reaching the heating object is prevented from being attenuated. This allows the heating object to efficiently absorb the infrared light W2 radiated from the converter 14 and efficiently converts the infrared light W2 into the heat of the heating object. As a result, the power consumption necessary for heating the heating object further decreases.

The arrangement of the heating device 10 is not particularly limited. In some embodiments, it may be preferable to arrange the heating device 10 such that the distance between the heating object and the surface of the infrared light radiator 15 facing the heating object is 2 to 20 mm. Setting the distance to 2 mm or more prevents the heating object and the heating device 10 from contacting each other when the heating object is moved. If the region between the heating device 10 and the heating object includes a substance (for example, water vapor) that absorbs the infrared light W2 radiated from the converter 14, the infrared light W2 greatly attenuates when passing through the region, thereby limiting a temperature increase in the heating object. Such a situation is prevented by setting the distance to 20 mm or less.

In the method for manufacturing the film-coated glass sheet, a thin film may be formed on a glass member (heating object) having a thickness of greater than 0.3 mm.

The heating process (heating step) using the heating device 10 does not have to be performed with the objective of heating the film-forming object when forming a film through CVD or sputtering. Instead, the heating process may be performed to heat the heating object made of glass with various objectives.

The technical idea obtainable from the above-described embodiment and modifications will be described.

(i) A method for manufacturing a glass article, in which the converter includes:

a first converting section that converts the infrared light radiated from the radiant heat source into infrared light of a spectrum having a first pattern; and a second converting section that converts the infrared light radiated from the radiant heat source into infrared light of a spectrum having a second pattern that differs from the first pattern, and the surface of the converter facing the heating object includes a surface of the first converting section and a surface of the second converting section.

EXAMPLES

The present embodiment will now be described in more detail with reference to Example and Comparative Examples, although the present invention is not limited to these examples.

Example 1

As shown in FIG. 3, the converter 14, which converted the spectrum of the infrared light W1 radiated from the radiant heat source 12, was arranged between the radiant heat source 12, which radiated the infrared light W1, and the thin glass sheet G. Further, a heating test was conducted in which the thin glass sheet G was heated by causing the thin glass sheet G to absorb the infrared light W2 radiated from the converter 14. In addition, the power consumed by the radiant heat source 12 until the thin glass sheet G was heated to 600° C. was measured. The results are shown in Table 1.

As shown in FIG. 3, the converter 14 included the infrared light absorber 16 in which blackbody-like paint was applied to the entire surface (first surface 15a) of the plate-shaped infrared light radiator 15 facing the radiant heat source 12. The detail of each member used for the heating test is as follows.

Thin glass sheet: non-alkali glass of 50 mm long, 300 mm wide, and 50 nm thick

Radiant heat source: halogen lamp

Infrared light radiator: crystalized glass of 50 mm long, 350 mm wide, and 1.5 mm thick Infrared light absorber: blackbody-like paint (JSC-3, produced by Japan Sensor Corporation)

Comparative Example 1

Instead of the converter 14 of Example 1, the converter 14 of Comparative Example 1 included the infrared light absorber 16 in which the blackbody-like paint was applied to the entire surface (first surface 15*a*) of the plate-shaped infrared light radiator 15 facing the radiant heat source 12 and the entire surface (second surface 15*b*) of the infrared light radiator 15 facing the heating object. Other than this condition, the heating test was conducted in the same manner as that of Example 1. The power consumed by the radiant heat source 12 until the thin glass sheet G was heated to 600° C. was measured. The results are shown in Table 1.

Comparative Example 2

Instead of the converter 14 of Example 1, the plate-shaped infrared light radiator 15 that did not include the infrared light absorber 16 was used. Other than this condition, the heating test was conducted in the same manner as that of Example 1. The power consumed by the radiant heat source 12 until the thin glass sheet G was heated to 600° C. was measured. The results are shown in Table 1.

TABLE 1

| | Infrared Light Absorber | | |
|---|---|---|---|
| | Radiation Heat Source Side (on first surface 15a) | Heating Object Side (on second surface 15b) | Power Consumption (W) |
| Example 1 | Included | Not Included | 3350 |
| Comparative Example 1 | Included | Included | 3570 |
| Comparative Example 2 | Not Included | Not Included | >4000 |

As shown in Table 1, the power consumption for heating the thin glass sheet G to the target temperature was lower in Example 1 than in Comparative Example 1 and Comparative Example 2. In the heating test of Comparative Example 2, the temperature of the thin glass sheet G did not reach 600° C. at the point in time at which the power consumption exceeded 4000 W and thus the test was ended at that point. These results indicate that when the radiant heat source is used to heat the heating object made of glass, the power consumption is reduced by arranging the converter having a specific structure between the radiant heat source and the heating object.

DESCRIPTION OF REFERENCE CHARACTERS

G) Thin Glass Sheet; Ga) Film-Coated Glass Sheet; W1, W2) Infrared Light; 10) Heating Device; 11) Casing; 12) Radiant Heat Source; 13) Light-Gathering Mirror; 14) Converter; 15) Infrared Light Radiator; 15*a*) First Surface; 15*b*) Second Surface; 16) Infrared Light Absorber; 17) Thermal Conduction Portion; 18) Transmission Portion; 20) Film-Forming Device

The invention claimed is:

1. A method for manufacturing a glass article, the method comprising a heating step that heats a heating object made of glass, wherein the heating step includes heating the heating object by converting, by a converter arranged between the heating object and a radiant heat source that radiates infrared light, a spectrum of the infrared light radiated from the radiant heat source and causing the heating object to absorb the infrared light radiated from the converter, the converter includes:

an infrared light absorber that generates heat by absorbing the infrared light radiated from the radiant heat source; and an infrared light radiator made of a silicon-containing material, the infrared light radiator being heated through thermal conduction from the infrared light absorber, wherein the infrared light absorber defines a space through which the infrared light radiated from the radiant heat source is transmitted through, and at least part of a surface of the converter facing the heating object includes at least part of a surface of the infrared light radiator.

2. The method according to claim 1, wherein the infrared light absorber is made of a blackbody material.

3. The method according to claim 1, wherein the infrared light radiator is made of glass.

4. The method according to claim 1, wherein the heating object is a thin glass sheet having a thickness of 0.3 mm or less.

5. The method according to claim 4, wherein the glass article is a film-coated glass sheet obtained by forming a thin film on a surface of the thin glass sheet, and the heating step is performed to heat the thin glass sheet during formation of the thin film on the surface of the thin glass sheet through CVD or sputtering.

6. The method according to claim 1, wherein the infrared light radiator is in contact with the infrared light absorber.

7. A method for heating a thin glass sheet having a thickness of 0.3 mm or less, the method comprising heating the thin glass sheet by converting, by a converter arranged between the thin glass sheet and a radiant heat source that radiates infrared light, a spectrum of the infrared light radiated from the radiant heat source and causing the thin glass sheet to absorb the infrared light radiated from the converter, wherein the converter includes:

an infrared light absorber that generates heat by absorbing the infrared light radiated from the radiant heat source; and an infrared light radiator made of a silicon-containing material, the infrared light radiator being heated through thermal conduction from the infrared light absorber, wherein the infrared light absorber defines a space through which the infrared light radiated from the radiant heat source is transmitted through.

8. The method of claim 1, wherein the heating step includes heating the object with a heating device, the heating device including a casing housing the converter, the converter being positioned adjacent an end of the casing and spaced from the radiant heat source.

9. The method of claim 1, wherein:
the infrared light absorber defines a plurality of spaces; and
the space is one space of the plurality of spaces.

10. The method of claim 2, wherein the blackbody material includes carbon.

* * * * *